United States Patent
Klein et al.

(10) Patent No.: US 11,212,624 B2
(45) Date of Patent: Dec. 28, 2021

(54) MEMS-TRANSDUCER AND METHOD FOR PRODUCING A MEMS-TRANSDUCER

(71) Applicant: Infineon Technologies AG, Neubiberg (DE)

(72) Inventors: Wolfgang Klein, Zorneding (DE); Karolina Gierl, Regensburg (DE); Markus Meyer, Sinzing (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/533,214

(22) Filed: Aug. 6, 2019

(65) Prior Publication Data
US 2020/0084549 A1 Mar. 12, 2020

(30) Foreign Application Priority Data
Sep. 6, 2018 (EP) .................................... 18193066

(51) Int. Cl.
*H04R 19/00* (2006.01)
*B81B 3/00* (2006.01)
*H04R 31/00* (2006.01)

(52) U.S. Cl.
CPC ......... *H04R 19/005* (2013.01); *B81B 3/0051* (2013.01); *H04R 31/006* (2013.01); *B81B 2201/0257* (2013.01)

(58) Field of Classification Search
CPC ............ B81B 2201/00; B81B 2201/02; B81B 2201/0221; B81B 2201/0257; B81B 2201/0264; B81B 2201/0271; B81B 2201/0285; B81B 2203/01; B81B 2203/0127; H04R 19/00; H04R 19/005; H04R 19/04; H04R 2201/00; H04R 2201/003; H04R 2499/10; H04R 2499/11; H04R 2499/15
See application file for complete search history.

(56) References Cited

U.S. PATENT DOCUMENTS

| 6,641,273 | B1* | 11/2003 | Staker | B81B 3/0051 |
| | | | | 359/224.1 |
| 2002/0067663 | A1* | 6/2002 | Loeppert | H04R 31/00 |
| | | | | 367/181 |
| 2010/0158279 | A1* | 6/2010 | Conti | H04R 7/24 |
| | | | | 381/174 |
| 2012/0326249 | A1* | 12/2012 | Rombach | B81C 1/00984 |
| | | | | 257/416 |

(Continued)

FOREIGN PATENT DOCUMENTS

| DE | 102015108918 A1 | 12/2015 | |
| DE | 102017204006 B3 * | 8/2018 | ........... B81B 3/0054 |
| EP | 2468679 A2 | 6/2012 | |

*Primary Examiner* — Walter F Briney, III
(74) *Attorney, Agent, or Firm* — Slater Matsil, LLP

(57) ABSTRACT

A MEMS-transducer comprises a membrane structure having a first main surface and a second main surface opposing the first main surface. A substrate structure holds the membrane structure, wherein the substrate structure overlaps with the first main surface of the membrane structure in a first edge region being adjacent to a first inner region of the first main surface. A gap is formed between the membrane structure and the substrate structure in the first edge region and extends from the first inner region into the first edge region.

10 Claims, 10 Drawing Sheets

(56) References Cited

U.S. PATENT DOCUMENTS

| | | | |
|---|---|---|---|
| 2013/0139594 A1* | 6/2013 | Mao | G01P 15/08 |
| | | | 73/514.01 |
| 2015/0245146 A1 | 8/2015 | Liu et al. | |
| 2015/0256924 A1* | 9/2015 | Hoekstra | H04R 19/04 |
| | | | 257/416 |
| 2015/0358735 A1 | 12/2015 | Klein et al. | |
| 2017/0078802 A1* | 3/2017 | Ravnkilde | H04R 7/16 |
| 2019/0349687 A1* | 11/2019 | Murakami | B81B 3/0021 |

\* cited by examiner

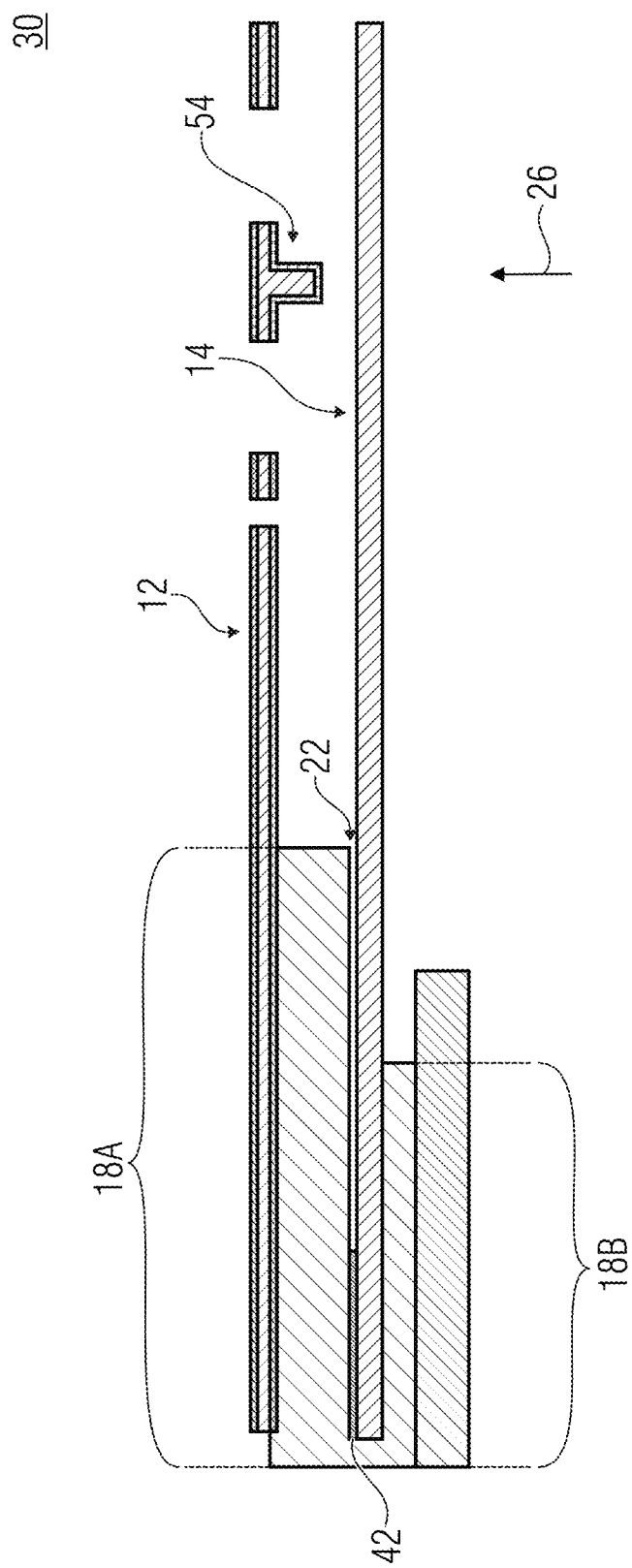

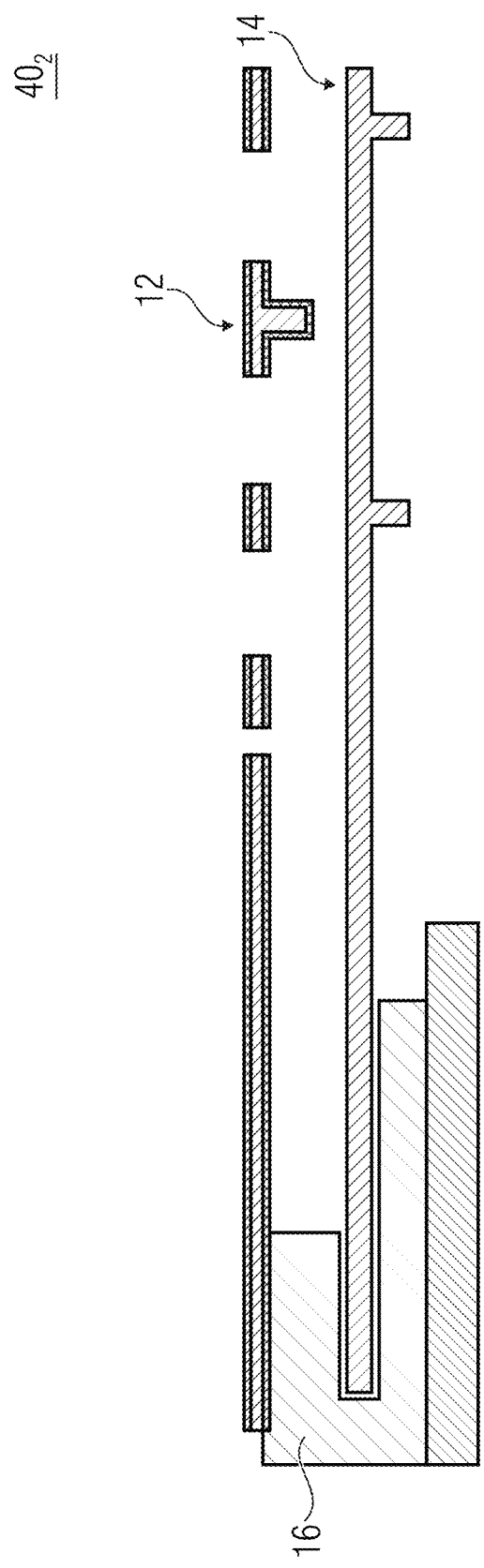

MEMS-TRANSDUCER AND METHOD FOR PRODUCING A MEMS-TRANSDUCER

This application claims the benefit of European Application No. 18193066.0, filed on Sep. 6, 2018, which application is hereby incorporated herein by reference.

TECHNICAL FIELD

The present disclosure is related to a MEMS-transducer and to a method for producing a MEMS-transducer. The present disclosure further relates to a carbon gap in a MEMS-transducer.

BACKGROUND

Sound transducers such as microphones and/or loudspeakers may be implemented as micromechanical systems (MEMS). Such MEMS-transducers may be implemented using semiconductor materials, enabling a production of the transducers on a wafer level. Such transducers may comprise a movable or vibratable electrode and a static electrode. The movable electrode may be implemented as membrane or diaphragm being deflectable with respect to the static electrode.

There is a request for MEMS-transducers comprising a high robustness, in particular with respect to a mechanical load or stress.

SUMMARY

Embodiments provide a MEMS-transducer comprising a membrane structure having a first main surface and a second main surface opposing the first main surface. The MEMS-transducer comprises a substrate structure configured to hold the membrane structure, wherein the substrate structure overlaps with the first main surface of the membrane structure in a first edge region being adjacent to a first inner region of the first main surface. A gap is formed between the membrane structure and the substrate structure in the first edge region, the gap extending from the first inner region into the first edge region. The gap allows for a low mechanical load acting on the membrane structure during deflection and therefore for a high robustness with regard to a mechanical load.

A further embodiment provides a method for producing a MEMS-transducer. The method comprises arranging a layer stack comprising a membrane structure, a substrate structure holding the membrane structure and a carbon layer arranged between the membrane structure and the substrate structure. The method comprises removing the carbon layer at least partially so as to generate a gap between the membrane structure and the substrate structure in a first edge region, such that the gap extends from a first inner region of a first main surface to the membrane structure into a first edge region in which the substrate structure overlaps with the first main surface of the membrane structure, the first edge region being adjacent to the first inner region of the first main surface.

Further embodiments are described in the dependent claims.

BRIEF DESCRIPTION OF THE DRAWINGS

Embodiments will be described in the following while making reference to the accompanying drawings in which:

FIG. 3 shows a schematic side view of a MEMS-transducer according to an embodiment, implemented as a single-backplate transducer;

FIG. 4b shows a schematic side view of a layer stack that may be obtained by partially removing material of the substrate structure from the layer stack of FIG. 4a;

FIG. 4d shows a schematic side view of a MEMS-transducer according to an embodiment which may be formed as a single backplate structure but similar to the MEMS-transducer of FIG. 4c.

DETAILED DESCRIPTION OF ILLUSTRATIVE EMBODIMENTS

Figure 1A:
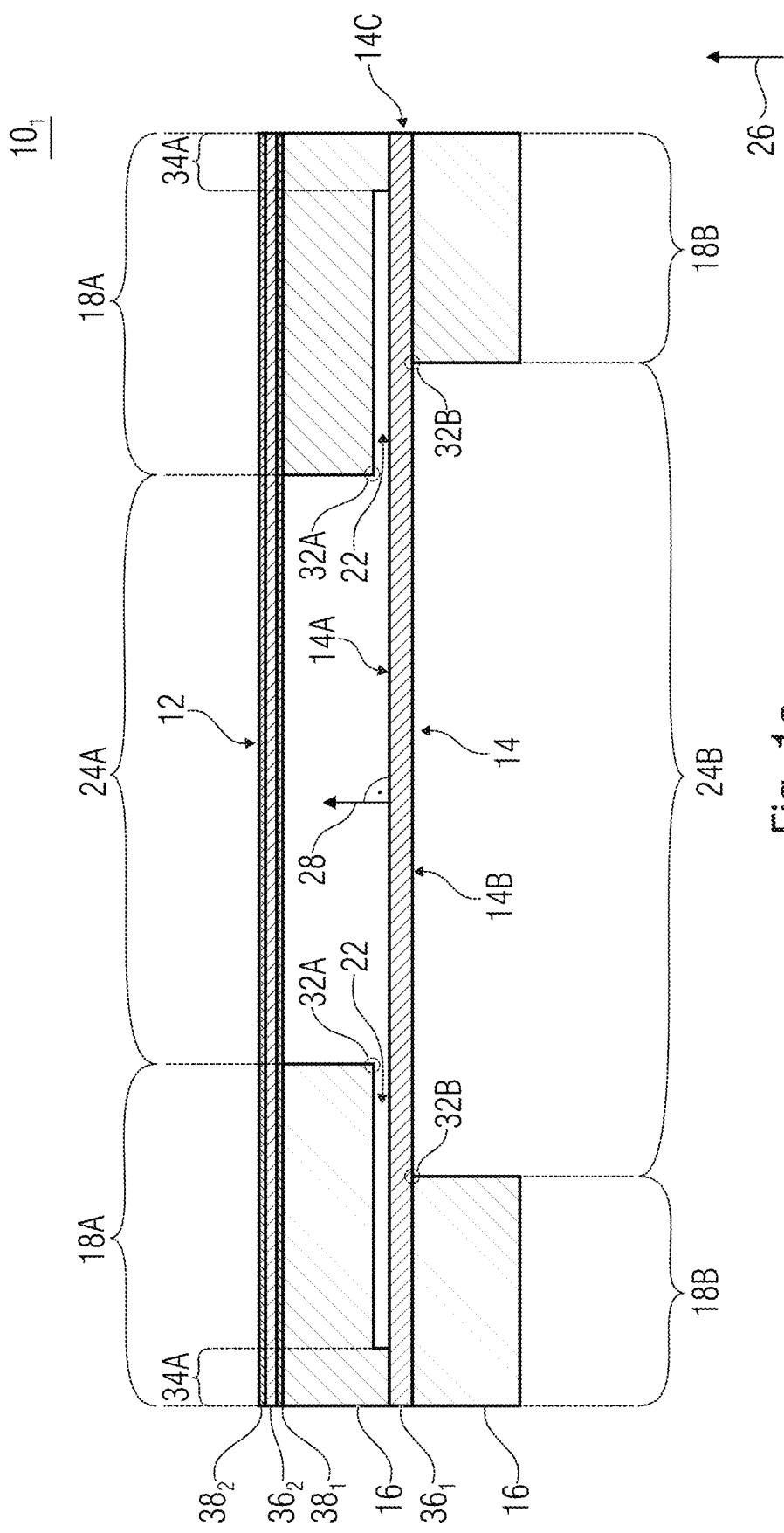
FIG. 1a shows a schematic side view of a MEMS-transducer according to an embodiment.

Equal or equivalent elements or elements with equal or equivalent functionality are denoted in the following description by equal or equivalent reference numerals even if occurring in different figures.

In the following description, a plurality of details is set forth to provide a more thorough explanation of embodiments of the present invention. However, it will be apparent to those skilled in the art that embodiments of the present invention may be practiced without these specific details. In other instances, while known structures and devices are shown in block diagram forms rather than in detail in order to avoid obscuring embodiments of the present invention. In addition, features of the different embodiments described hereinafter may be combined with each other, unless specifically noted otherwise.

Embodiments described herein relate to micromechanical structures (MEMS) forming a sound transducer or comprising such a sound transducer. MEMS-sound transducers may comprise or form a loudspeaker and/or a microphone. The MEMS-sound transducers or MEMS-transducers are configured to effect a movement of a movable element, i.e., a membrane, based on an electric driving signal such that a fluid is moved responsive to the movement of the membrane and such that a sound pressure level is generated in the fluid. In contrast to the described loudspeaker-configuration, a movement in the fluid may effect a deflection of the membrane, the deflection being detectable by measuring a variable electric potential and/or a variable electric capacity in a microphone-configuration. In the microphone-configuration, an electric signal may be obtained based on the movement in the fluid.

MEMS-transducers may be manufactured in semiconductor-technology and/or may comprise semiconductor materials. Examples for such materials are layers or wafers comprising a silicon material, a gallium-arsenite-material and/or a different semiconductor material. MEMS-structures may comprise one or more layer sequences or stacks of layers comprising conductive, semiconductive and/or insulating layers so as to implement a respective MEMS-functionality. In embodiments described herein, one or more backplate electrodes may form a stack together with a membrane structure, wherein the backplate electrodes and the membrane structure may be held, fixed and/or clamped at respective outer regions with a substrate structure. The substrate structure may comprise, for example, amorphous, polycrystalline or crystalline semiconductor materials such as silicon.

FIG. 1a shows a schematic side view of a MEMS-transducer $10_1$ according to an embodiment. The MEMS-transducer may form or may at least be integrated into a MEMS-microphone or a MEMS-loudspeaker. The MEMS-transducer $10_1$ may comprise a backplate structure 12 forming a stack with a membrane structure 14, i.e., the membrane structure 14 may be arranged so as to oppose the backplate structure 12. The membrane structure 14 may be movable and/or vibratable with respect to the backplate structure 12. For example, when compared to the membrane structure 14, the backplate structure 12 may comprise a comparatively high stiffness and may be regarded as stationary with respect to the membrane 14. The MEMS-transducer may comprise a substrate structure 16 configured to hold the membrane 14 and/or the backplate structure 12. The substrate structure 16 may comprise a doped or undoped semiconductor material such as a silicon material and/or a gallium-arsenite material or the like. The substrate structure 16 may comprise one or more layers. Further, the substrate structure 16 may be arranged adjacent to a first main surface 14A of the membrane structure and adjacent to a second main surface 14B of the membrane structure. The main surfaces 14A and 14B may be the surfaces of the membrane structure 14 configured to interact with a fluid. According to an example, the main surfaces 14A and 14B may be those surfaces of the membrane structure 14 comprising a larger surface when compared to a side surface 14C of the membrane structure 14, the side surface 14C connecting the main surfaces 14A and 14B. Thus, the main surfaces 14A and 14B may be arranged so as to oppose each other.

The substrate structure 16 may thus overlap with an edge region 18A of the main surface 14A and/or with an edge region 18B of the second main surface 14B. Such an overlap may comprise a mechanical contact between the substrate structure 16 and the membrane structure 14 that is not limited hereto. In particular, between the substrate structure 16 and the first main surface 14A and/or the second main surface 14B, there may be arranged a gap 22.

The gap 22 may be arranged so as to extend an inner region 24A of the main surface 14A towards or into the edge region 18A, from an inner region 24B of the second main surface 14B towards the edge region 18B, respectively. The gap 22 may provide for a contactless overlap of the substrate structure 16 in a region of the gap 22. For example, the substrate structure 16 may be removed partially so as to obtain the gap 22 and so as to further release the membrane structure 14.

For example, the membrane structure 14 may be deflectable or vibratable along a deflection direction 26 that may be arranged in parallel to a surface normal 28 of the main surface 14A or 14B. For example, a deflection of the membrane structure 14 along a positive deflection direction 26 may lead to an abutment of the membrane structure 14 against the substrate structure 16 in a corner region 32A thereof. As a result of said abutment, main surface 14A would experience a compressive stress, while main surface 14B would experience a tensile stress. The membrane structure 14 may be formed, for example, so as to comprise a semiconductor material and may thus be robust with respect to compressive stress whilst being less robust with respect to tensile stress. When imagining an absence of the gap 22 and a presence of the substrate structure 16 in the region of the gap 22, the substrate structure 16 being further fixed or adhered to the membrane structure 14 and when further imagining a deflection of the membrane structure 14 towards a negative deflection direction 26, then a mentioned tensile stress might act on the membrane structure 14 at the corner region 32A and might thus lead to a damage of the membrane structure 14 which is prevented by use of the gap 22.

However, in presence of the gap 22, when being deflected along the negative deflection direction 26, in a corner region 32B, a compression force may act on the membrane structure 14. When deflecting the membrane structure 14 towards the positive deflection direction 26, then only low peeling forces may act in the corner region 32B as the deflection in the region of the corner region 32B is limited by the gap 22, the abutment at the corner region 32A respectively. Thus, the MEMS-transducer $10_1$ may comprise a high robustness to deflecting forces, the deflecting forces being obtained by a fluid pressure and/or electronic signals.

The gap 22 may at least partially uncover the first main surface 14A, the second main surface 14B, respectively. When uncovering the respective main surface partially, an outer region 34A of the substrate structure 16 may remain in contact with the membrane structure 14.

In the absence of the gap 22, although the edge region 18A is illustrated as covering a large portion of the first main surface 14A when compared to the edge portion 18B covering a comparatively small portion of the main surface 14B of the MEMS structure, the edge portion 18B may be equal to the edge portion 18A or may be larger when compared to the edge portion 18A. For example, the edge portion 18A may be larger than the edge portion 18B when configuring the MEMS-transducer $10_1$ as a so-called bottom port transducer, e.g., when sound is expected to arrive at the main surface 14B. Alternatively, when providing a top port transducer for which sound is expected to arrive at the main surface 14A, the edge portion 18B may be larger when compared to the edge portion 18A. In contrast, since the gap 22 results in a substantially symmetric robustness of the membrane structure 14, the relative length and overlap of the edge portions 18A and 18B can be independent of the top or bottom port configuration.

The membrane structure 14 may comprise a conductive layer $36_1$, for example, comprising a conductive semiconductive material. A conductive semiconductive material may be obtained, for example, by doping a semiconductive material. This may allow using the conductive layer $36_1$ as an electrode layer. Alternatively or in addition, the backplate structure 12 may comprise a conductive layer $36_2$ so as to provide for an electrode layer in the backplate structure 12. Between the backplate structure 12 and the membrane structure 14, one or more insulating layers $38_1$ may be arranged so as to prevent an electric short-circuit in case of a mechanical contact between the membrane structure 14 and the backplate structure 12. Alternatively or in addition, a mechanical protection or stiffening may be obtained by use of the insulating layer $38_1$. For passivation and/or mechanical protection, further insulating layers $38_2$ may be arranged so as to cover one or more sides of the conductive layers $36_1$ and/or $36_2$. The insulating layers $38_1$ and/or $38_2$ may comprise, for example, an insulating material such as a silicon-nitride material (SiN), a silicon-oxide material (SiO) or a different insulating material. As a stiffness of the insulating layers $38_1$ and/or $38_2$ may be higher when compared to a stiffness of a conductive material of the conductive layers $36_1$ and $36_2$, an arrangement of the insulating layers 38 at immobile electrode structures such as the backplate structure 12 may allow for a low influence of the insulating layers on the vibrational behavior. On the other hand, according to an embodiment, an insulating layer 38 may be arranged at the main surface 14A and/or 14B so as to obtain a membrane structure 14 with a high robustness.

Figure 1B:
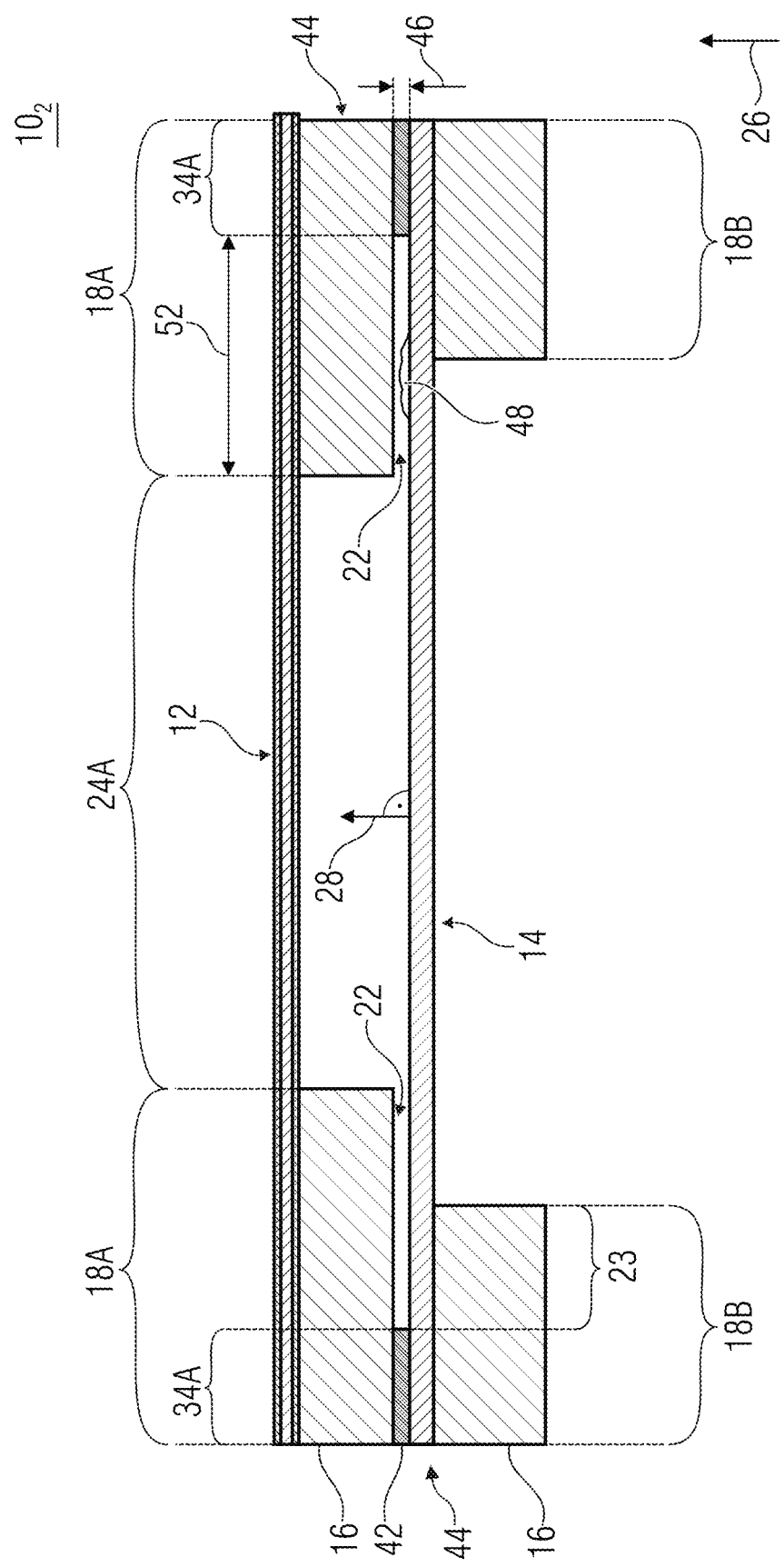
FIG. 1b shows a schematic block diagram of a MEMS-transducer according to an embodiment comprising a carbon layer arranged into which a gap is formed.

FIG. 1b shows a schematic block diagram of a MEMS-transducer $10_2$ according to an embodiment. When compared to the MEMS-transducer $10_1$, the MEMS-transducer $10_2$ comprises a carbon layer arranged therein having at least one carbon layer 42, the carbon layer 42 comprising a carbon material. The carbon layer 42 may be arranged in the outer region 34A adjacent to the gap 22, i.e., the gap 22 may extend from the inner region 24A towards the outer region 34A and may thus connect the carbon layer 42 and the inner region 24A.

The gap 22 may be formed so as to overlap with the edge region 18B on the opposing main surface 14B of the membrane structure 14 by an overlap extension 23 that may be, for example, at least 1 µm, e.g., at least 1 µm and at most 50 µm, at least 1.5 µm and at most 20 µm or at least 2 µm and at most 7 µm, wherein especially high values are possible. It is noted, that the second edge region may be used as reference in case the MEMS-transducer is formed without a gap on the second main surface 14B as the edge region 18B then may be equal to an area or region in which the first main surface 14B is mechanically fixed to the substrate structure 16. For example, the gap 22 may thus overlap with the region of fixing when both, the gap 22 and the region of fixing are projected into the main surface 14A or 14B. According to an alternative embodiment, a further gap may be arranged at the main surface 14B so as to allow preventing a hot spot at the second main surface 14B such that the gaps and respective corner regions may limit the deflection of the membrane structure 14 and thus the mechanical load along both directions.

The carbon layer 42 and the gap 22 may be arranged in a same layer such that the carbon layer 42 is arranged between an outer edge 44 of the MEMS-transducer $10_2$ and the gap 22. The carbon layer 42 may be a part of the substrate structure 16 and may be configured for clamping or holding the membrane structure 14.

The gap 22 may comprise an extension along the deflection direction 26 and/or along the surface normal 24, i.e., along a thickness direction being at least 1 nm and at most 40 nm, at least 1.5 nm and at most 30 nm or at least 2 nm and at most 20 nm. Within the gap 22 and thereby reducing the effective free space, remains 48 of an oxidation process or ashing process may be arranged. For example, the gap 22 may be obtained by oxidizing or ashing the carbon layer 42, thereby generating the ash material 48. The ash material 48 may thus be arranged between the substrate structure 16 and the membrane structure 14.

A further extension 52 of the gap 22, which may be referred to as a broadness or a length of the gap 22 may be an extension between the inner region 24A and the edge region 34A. The extension 52 may be arranged along a direction perpendicular to the surface normal 28/thickness direction and may be arranged towards the outer edge 44 of the membrane structure 14. The extension 52 may be, for example, at least 1 µm and at most 200 µm, at least 10 µm and at most 150 µm or at least 20 µm and at most 100 µm such as approximately 40 µm. Any other value may be designed, for example, based on a dimension of the MEMS-sound transducer and/or based on the process used for generating the gap 22.

Figure 2A:
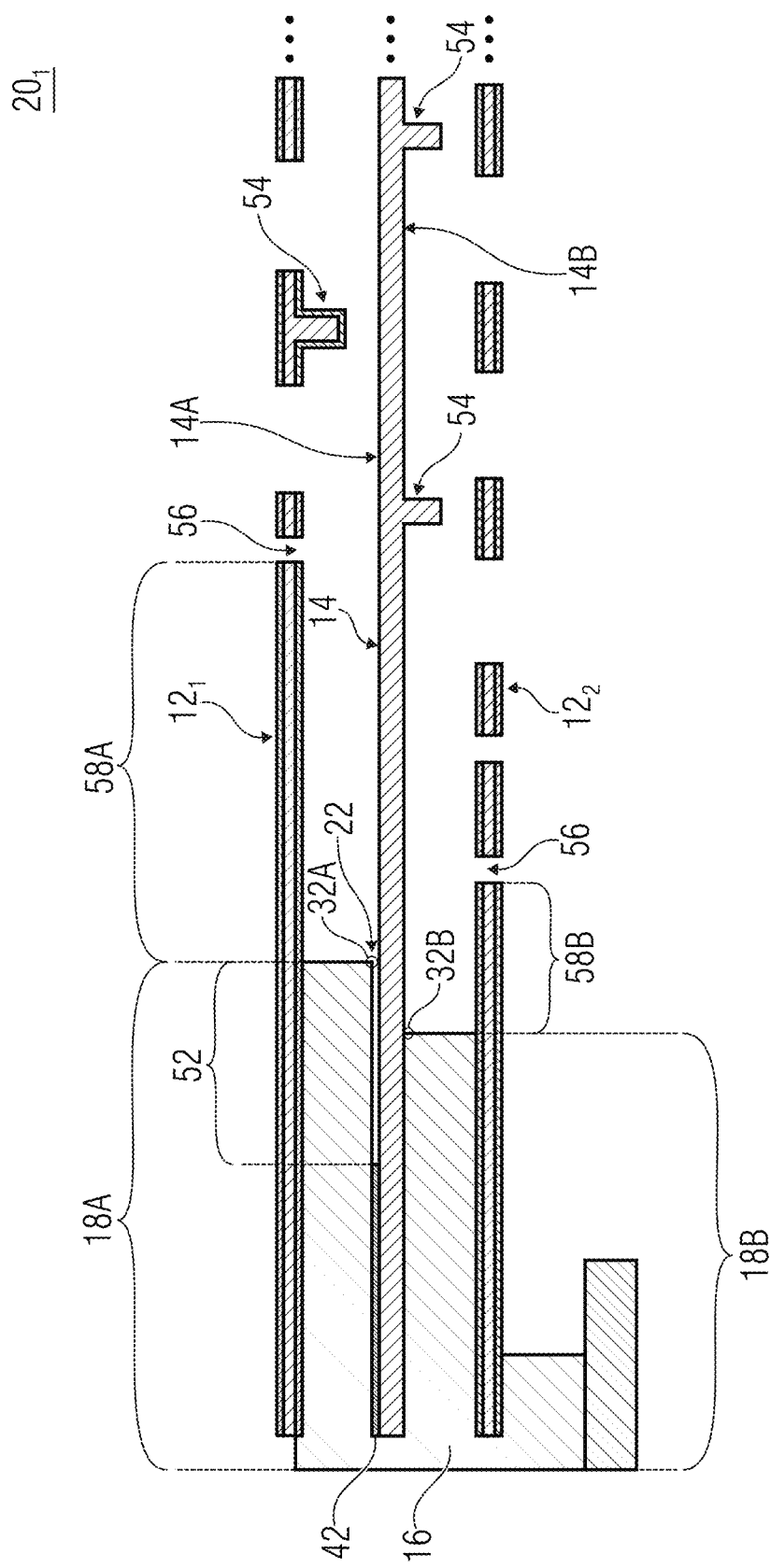
FIG. 2a shows a schematic side view of a MEMS-transducer according to an embodiment being implemented as a dual-backplate transducer.

FIG. 2a shows a schematic side view of a MEMS-transducer $20_1$ according to an embodiment. When compared to the MEMS-transducers $10_1$ and $10_2$ being implemented as a single-backplate transducer, the MEMS-transducer 201 may be implemented as a dual-backplate transducer, i.e., the membrane structure 14 may be arranged between two backplate structures $12_1$ and $12_2$, wherein both backplate structures $12_1$ and $12_2$ may be implemented as an electrode structure.

Between the backplate structure $12_1$ and the membrane structure 14 may be arranged one or more anti-stiction bumps that may be arranged at or part of the backplate structure $12_1$ and/or the membrane structure 14. Alternatively or in addition, between the membrane structure 14 and the backplate structure $12_2$, there may be arranged one or more anti-stiction bumps 54, wherein the anti-stiction bumps 54 may be arranged at or part of the membrane structure 14 and/or the backplate structure $12_2$. The anti-stiction bumps 54 may allow preventing stiction between the backplate structure $12_1$ and the membrane structure 14, the membrane structure 14 and the backplate structure $12_2$, respectively.

The backplate structure $12_1$ and/or the backplate structure $12_2$ may be formed as the backplate structure 12 of the MEMS-transducer $10_1$ and/or $10_2$. The backplate structures $12_1$ and/or $12_2$ may comprise release holes 56 that allow a travel of etching material such as plasma during a manufacturing of the MEMS-transducer $20_1$ towards the substrate structure 16, the membrane structure 14 and the carbon layer 42 in a region between the backplate structure $12_1$, $12_2$, respectively, and the membrane structure 14. This allows for removing the substrate structure 16 and/or the carbon layer 42. For example, the substrate structure 16 may comprise a material such as a silicon material or a TEOS material (tetraethyl orthosilicate). This may allow for a high selectivity of an etching process when compared to the carbon layer 42. Thus, the substrate structure 16 and/or the carbon layer 42 may be removed, at least partially, by performing an undercut or a lateral etching.

An extension 58A or 58B of such a lateral etching may be, for example, at least 1 µm and at most 200 µm, at least 2 µm and at most 100 µm or at least 5 µm and at most 70 µm, e.g., between 20 µm and 40 µm. Etching from a side adjacent to the main surface 14A during a first instance of time and etching from a side adjacent to the main surface 14B separately allows for obtaining different extensions 58A and 58B of the lateral etchings. Alternatively, a position of the release holes 56 may be selected appropriately so as to obtain edge regions 18A and 18B of different extensions. The gap 22 allows for preventing a hotspot of forces acting on the membrane structure 14 at the corner region 32A. At the same time, the small height or thickness of the gap 22 allows an early abutment of the membrane structure 14 at the corner region 32A so as to prevent a hotspot of such forces at a corner region 32B on the main surface 14B. Thereby, an approximately same robustness with regard to pulling forces and pushing forces may be obtained.

Figure 2B:
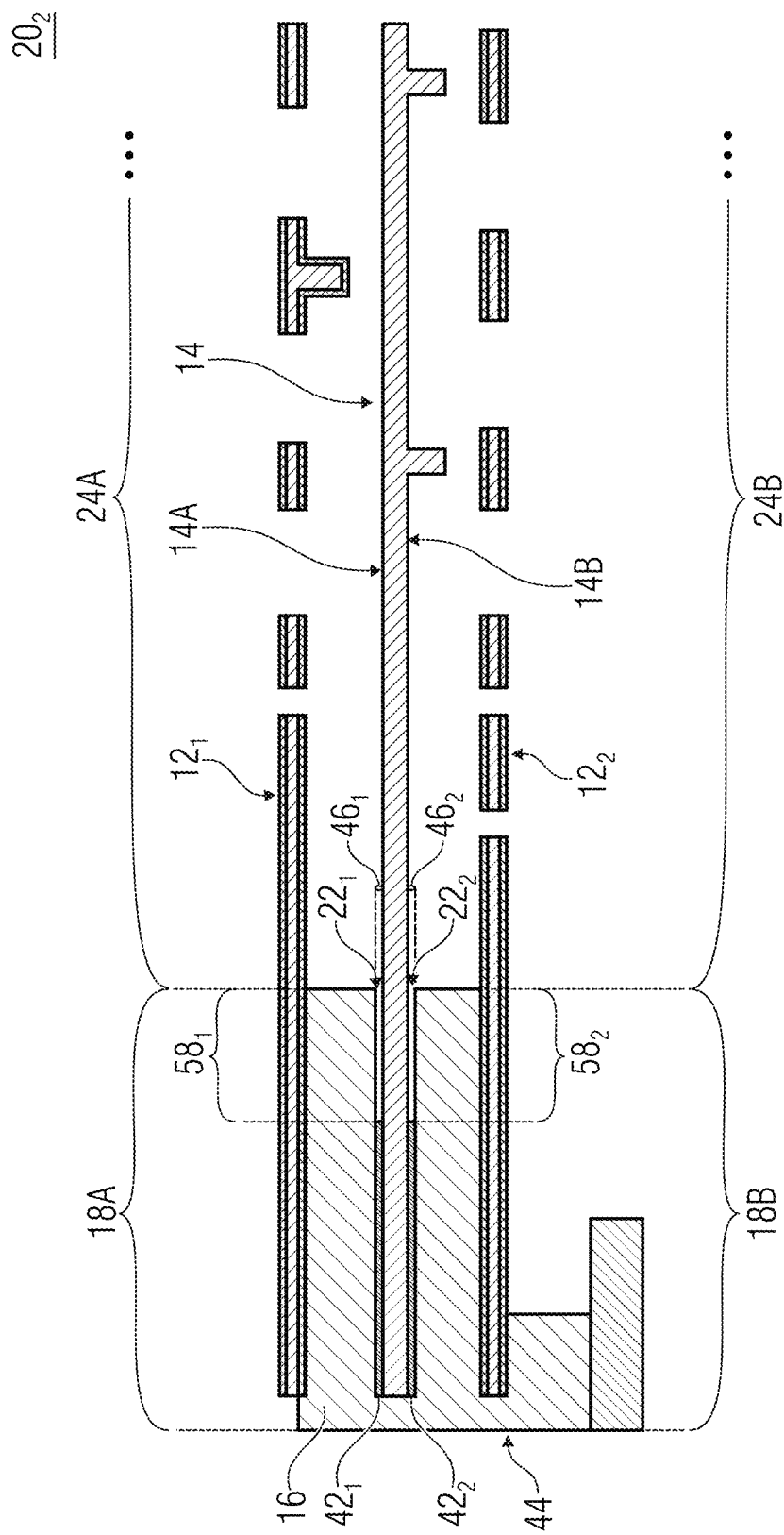
FIG. 2b shows a schematic side view of a MEMS-transducer according to an embodiment comprising a gap at each main surface of the membrane structure.

FIG. 2b shows a schematic side view of a MEMS-transducer $20_2$ according to an embodiment. When compared to the MEMS-transducer 201, the MEMS-transducer $20_2$ comprises two gaps $22_1$ and $22_2$, one gap arranged on each main surface 14A and 14B, i.e., prevention of a hotspot of forces acting on the membrane structure 14 may be implemented on both sides of the membrane structure 14. For example, a carbon layer $42_1$ may be arranged between the main side 14A and the substrate structure 16 and a further carbon layer $42_2$ may be arranged between the main surface 14B and the substrate structure 16. By removing the carbon layer $42_1$ and the carbon layer $42_2$ at least partially, gaps $22_1$ and $22_2$ may be generated. Based on extensions of the respective carbon layer 421 and 422, same or different heights $46_1$ and $46_2$ of the gaps $22_1$ and $22_2$ may be obtained. Alternatively or in addition, same or different extensions/lengths $58_1$ and $58_2$ may be generated.

Preventing a hotspot of forces using one or more gaps 22 may also allow for generating the edge regions 18A and 18B as having a same size between the outer edge 44 and the inner region 24A, the inner 24B, respectively. Whilst different extensions of the edge regions 18A and 18B may allow for defining a preferred direction along which the deflection of the membrane structure 14 is robust, such a measure may be unnecessary due to the positive effects of the gaps $22_1$ and/or $22_2$.

In other words, based on the single or double-carbon gap 22, the overlap of the TEOS edges as shown in FIG. 2a is uncritical.

FIG. 3 shows a schematic side view of a MEMS-transducer 30 according to an embodiment, wherein the MEMS-transducer 30 may be implemented similar to the MEMS-transducer $10_2$. The backplate structure 12 may comprise anti-stiction bumps directed towards the membrane structure 14 so as to prevent stiction.

Although the MEMS-transducers $20_1$, $20_2$ and 30 are described as having a remaining portion of the carbon layer 42 after removing the same so as to obtain the gap 22, according to an embodiment, the carbon layer 42, $42_1$ and/or $42_2$ may be removed completely. This may allow the gap to completely uncover the first main surface 14A and/or the second main surface 14B.

In the following, whilst making reference to FIGS. 4a to 4d, manufacturing of a MEMS-transducer according to an embodiment is described, wherein the MEMS-transducer does not only comprise gaps completely uncovering both main surfaces 14A and 14B of the membrane structure but additionally comprising a further, third gap connecting the first and the second gaps such that the first, second and third gaps provide for a slack holding of the membrane structure 14 by the substrate structure 16, i.e., the membrane structure 14 may be unclamped or loosely held.

Figure 4A:
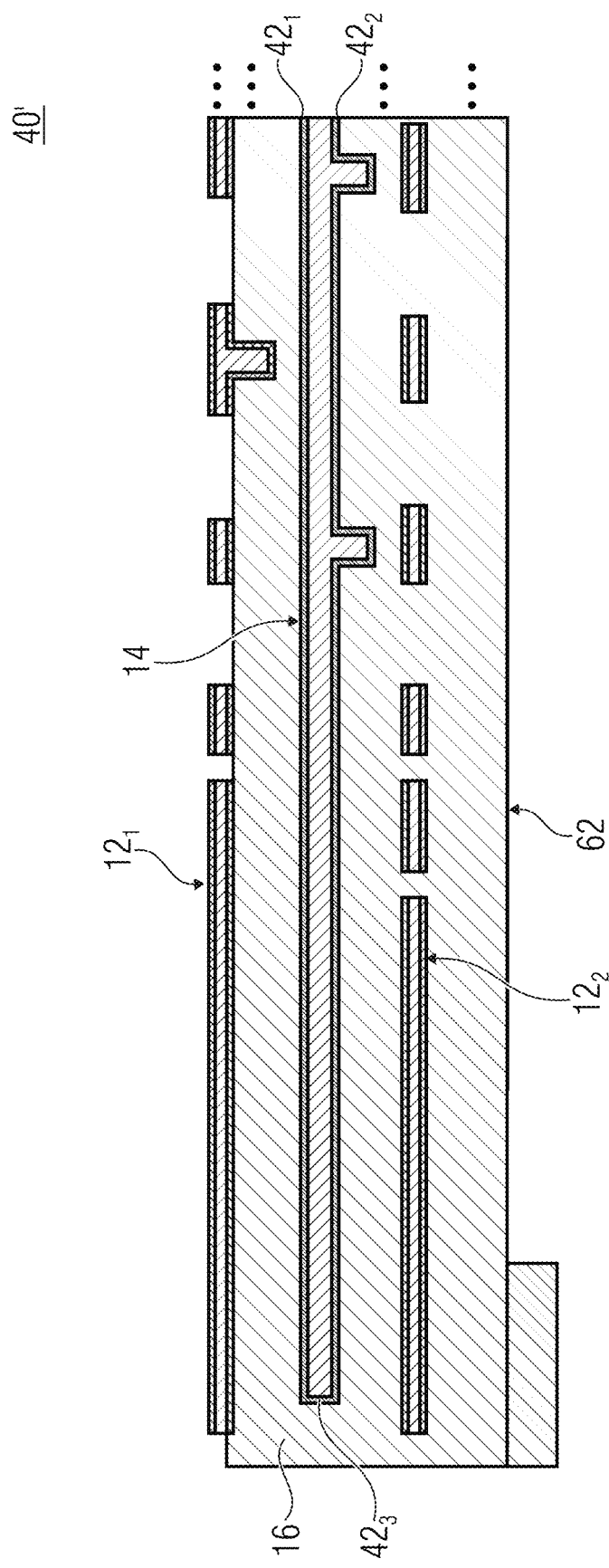
FIG. 4a shows a schematic side view of a layer stack comprising the substrate structure, the layer stack to be used in a method according to an embodiment.

FIG. 4a shows a schematic side view of a layer stack 40' comprising the substrate structure 16. By way of non-limiting example only, starting from a bottom side 62, the substrate structure 16 may be arranged, grown or deposited. After having reached a certain thickness of the substrate structure 16, the backplate structure $12_2$ may be deposited, generated or arranged, for example, by depositing, arranging or growing a set of layers comprising insulting layers and conductive layers. On top of the backplate structure $12_2$, further substrate materials of the substrate structure 16 may be arranged. For example, into the substrate structure 16 a topography may be inserted, for example, by implementing an etching process for selectively removing a part of the substrate structure 16. Thereby, holes may be obtained that may at least partially define anti-stiction bumps arranged at the membrane structure 14 later. A carbon layer $42_2$ may be deposited, generated or arranged, followed by depositing the membrane material. Previously, at the same time or afterwards, a carbon layer $42_3$ may be arranged along a height of the membrane structure 14 so as to provide for an encapsulation of the membrane structure 14 with respect to the substrate structure 16. On top of the membrane structure 14, the carbon layer $42_1$ may be deposited, followed by a deposition of further substrate materials. Further, the backplate structure $12_1$ may be arranged, generated or deposited, e.g., by arranging, depositing or growing one or more respective layers.

In other words, a membrane being encased or enveloped by carbon material may be used.

Figure 4B:
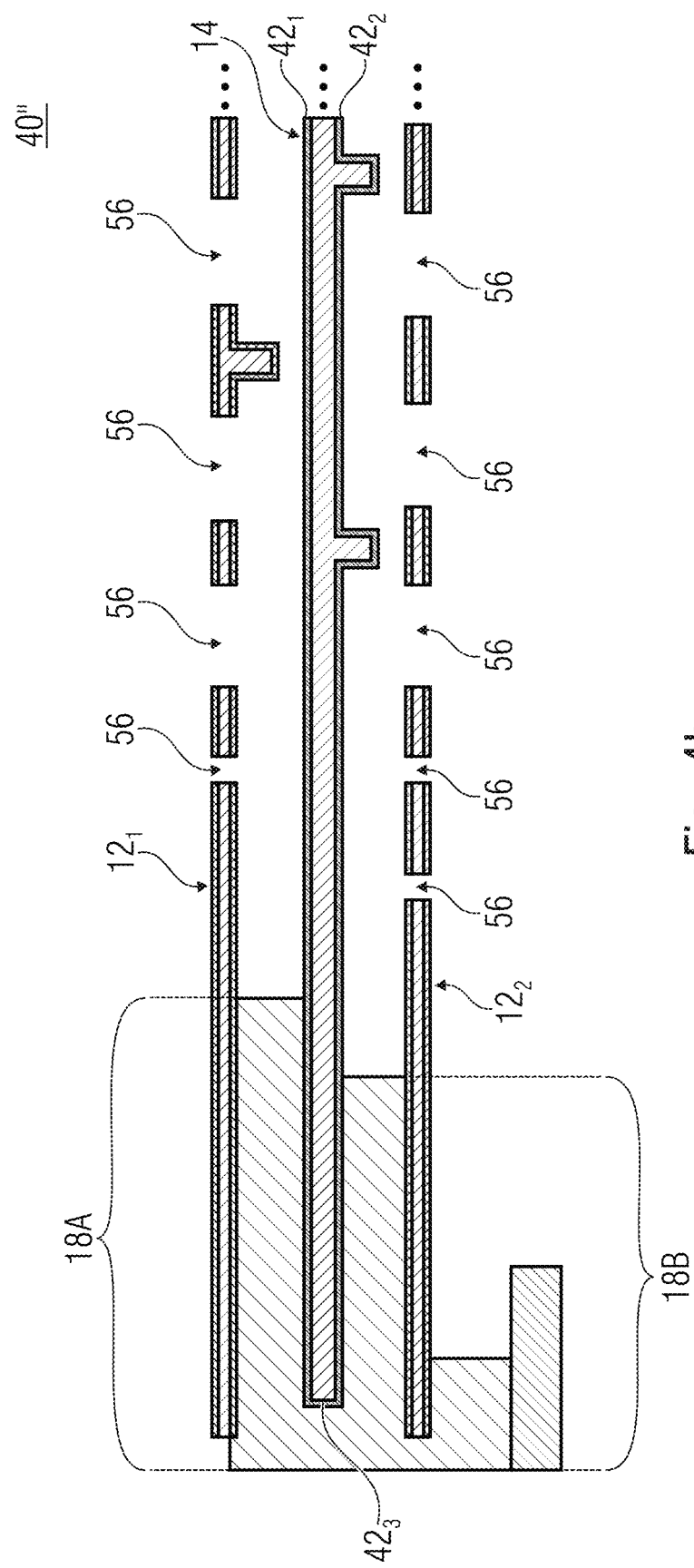

FIG. 4b shows a schematic side view of a layer stack 40" that may be obtained by partially removing material of the substrate structure 16, for example, by removing the substrate material arranged between a respective backplate structure $12_1$ or $12_2$ and the membrane structure 14. Thereby, the backplate structures $12_1$ and $12_2$ may be released as well as the membrane structure 14 with exception of the carbon layers $42_1$, $42_2$ and $42_3$. Based on the etching process, the edge regions 18A and 18B may be defined, in particular with regard to their extensions or sizes.

Figure 4C:
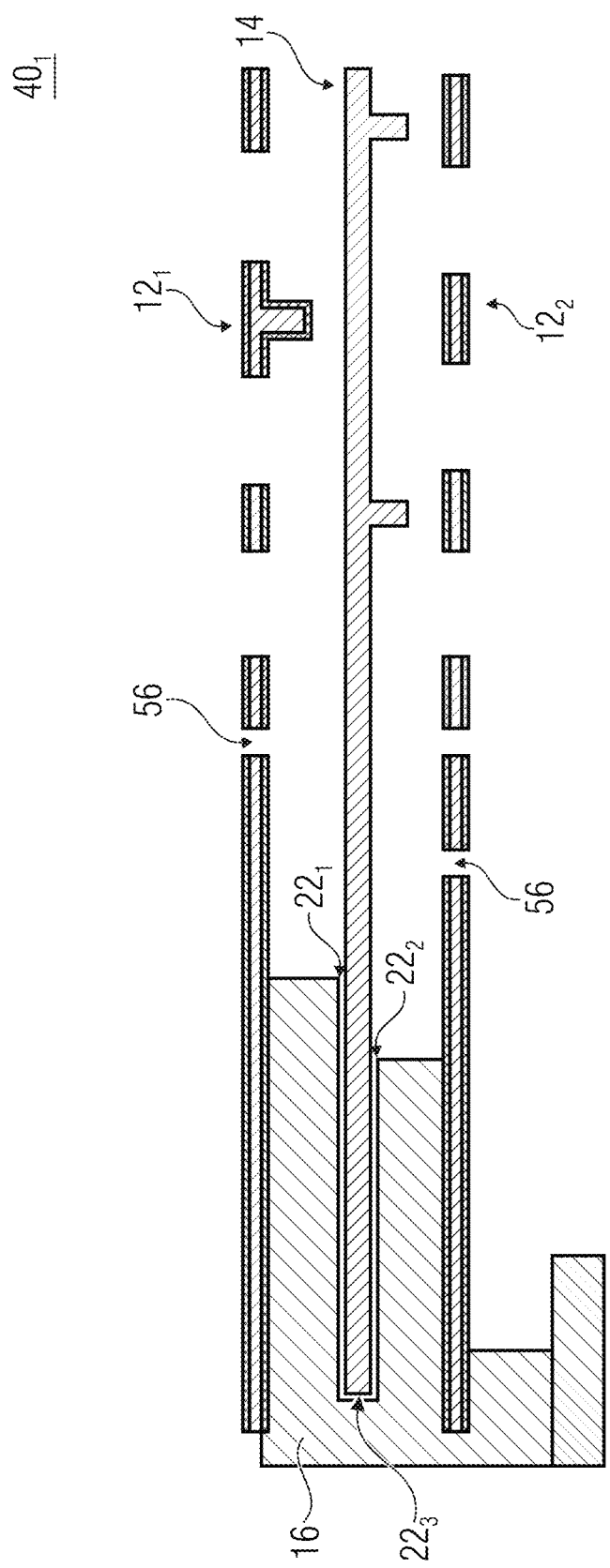
FIG. 4c shows a schematic side view of a MEMS-transducer according to an embodiment that may be obtained by further processing the layer stack shown in FIG. 4b.

FIG. 4c shows a schematic side view of a MEMS-transducer 401 according to an embodiment that may be obtained by further processing the layer stack 40" depicted in FIG. 4b. For example, by use of the release holes 56, the carbon layers $42_1$, $42_2$ and $42_3$ may be removed partially or completely. FIG. 4c shows a scenario in which the carbon layers $42_1$, $42_2$ and $42_3$ are removed completely so as to generate the membrane structure 14 as being loosely held by the substrate structure 16 as all of the clamping material, i.e., the carbon layers, is removed. Alternatively, the carbon layers $42_1$, $42_2$ and/or $42_3$ may remain partially, possibly preventing thereby a generation of the gap 223.

FIG. 4d shows a schematic side view of a MEMS-transducer $40_2$ according to an embodiment. When compared to the MEMS-transducer $40_1$, the MEMS-transducer $40_2$ may be implemented as a single backplate structure. For example, when referring again to FIG. 4a, a generation of the backplate structure $12_2$ may be omitted. As described with respect to the MEMS-transducer $40_1$, the membrane structure 14 may be completely released from the substrate structure 16. Alternatively, the membrane structure 14 may also be fixed to the substrate structure 16, either by remaining parts of the carbon layers $42_1$, $42_2$ and/or $42_3$ or by connecting the membrane structure 14 directly to the substrate structure 16 as described, for example, in connection with FIG. 1a.

Figure 5:
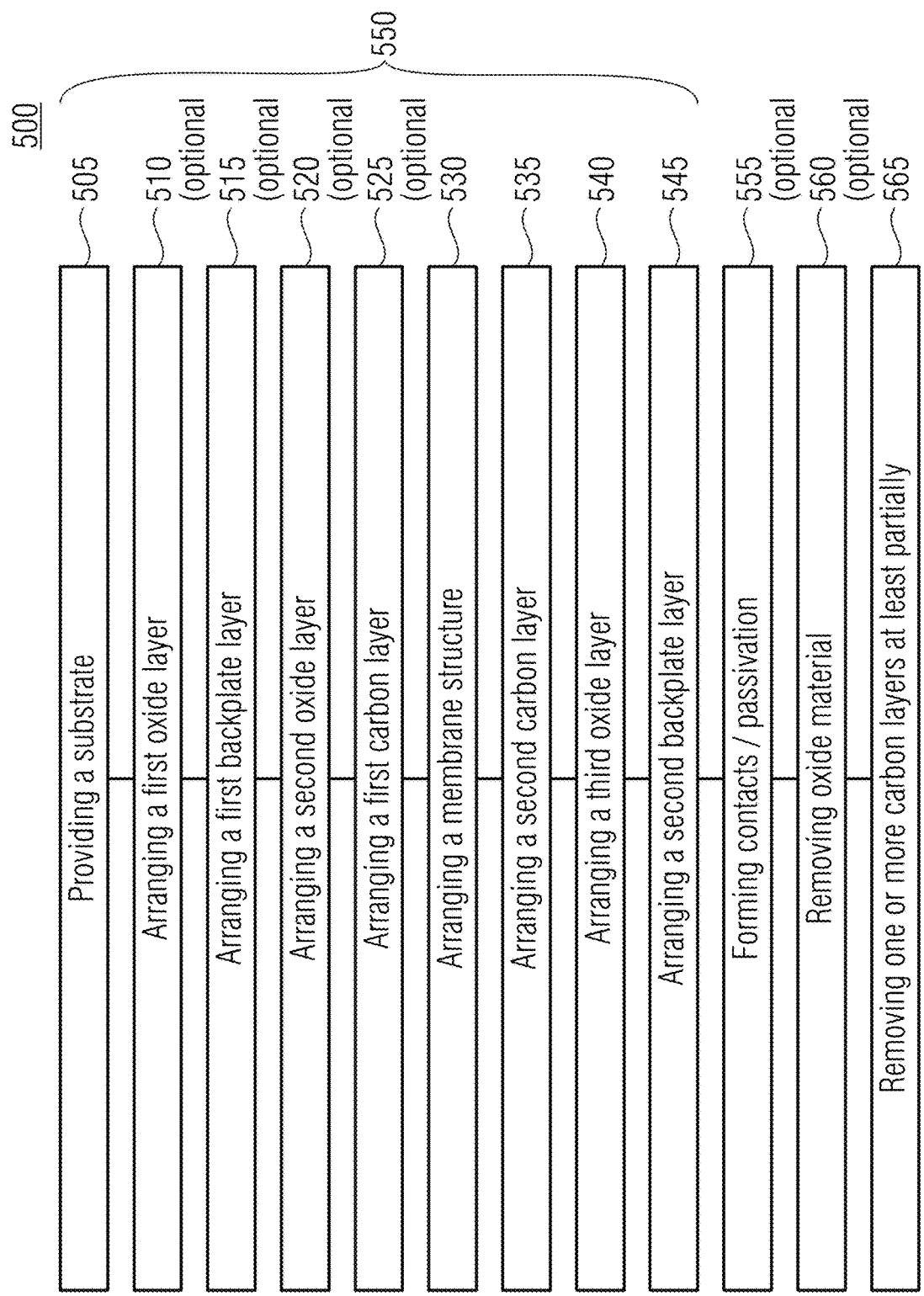
FIG. 5 shows a schematic flowchart of a method according to an embodiment.

FIG. 5 shows a schematic flowchart of a method 500 for producing a MEMS-transducer such as the MEMS-transducer $10_1$, $10_2$, $20_1$, $20_2$, 30, $40_1$ and/or $40_2$. The method 500 may comprise a step 550 in which a layer stack is arranged, the layer stack comprising a membrane structure, a substrate structure holding the membrane structure and a carbon layer arranged between the membrane structure and the substrate structure. When referring to FIG. 4a again, the layer stack 40' may be used for method 500 and obtained by a step 505 comprising providing a substrate, by a step 510 comprising arranging a first oxide layer, by a step 515 comprising arranging a first conductive backplate layer, by a step 520 comprising arranging a second oxide layer, wherein steps 510, 515 and 520 may be used for generating the backplate structure $12_2$. Step 515 may further comprise arranging a first carbon layer such as the carbon layer $42_2$ in an optional step 525, arranging a membrane structure in a step 530 and arranging a second carbon layer such as the carbon layer $42_1$ in a step 535. Meanwhile or additionally, the carbon layer may also be arranged at a lateral side of the membrane structure. According to embodiments, both steps 525 and 535 are executed resulting in two carbon layers that allow to implement a gap on each side of the membrane structure as it is described, for example, in connection with FIG. 2b. According to embodiments, it may be sufficient to implement only one of both steps, resulting in step 525 being optional without restricting method 500 to a specific side of the membrane structure at which the gap or carbon layer is arranged. This may be understood as step 535 being optional instead of step 525 and/or as a sequence of steps being variable in method 500, e.g., arranging the carbon layer may be performed prior and/or after arranging the membrane structure.

A step 540 of step 550 may comprise arranging a further oxide layer, for example, an oxide layer of the backplate structure $12_1$ facing the membrane structure 14. A step 545 may comprise arranging a further conductive backplate layer. As described in connection with the carbon layers, an order of steps illustrated in FIG. 5 may be in accordance with the depicted sequence or order but may also deviate. For example, as an alternative to execute both steps 515 and 545 so as to obtain a dual-backplate structure only one of both steps may be executed, being referred to as step 545. This step may be executed before or after arranging the membrane.

Optionally, contacts may be formed and/or a passivation may be obtained in step 555 and/or oxide material may be removed in an optional step 560, e.g., a part of an oxide layer that may be arranged on the backplate layer obtained in step 545. Both steps are optional and so is an order or sequence thereof when performing both steps 555 and 560. According to an embodiment, forming contacts and/or passivation in step 555 is performed before removing the oxide material in step 560. According to an embodiment, step 555 is executed after step 560. Prior to or after optional step 555 and/or optional step 560, a step 565 may be performed, comprising removing one or more carbon layers at least partially, i.e., removing of the carbon layer may be performed after a substrate etching for releasing the membrane structure such that the membrane structure is vibratable and/or after passivating the MEMS-transducer.

When making reference again to FIG. 2b and to FIG. 4b, removing of the carbon layer may be performed after the substrate etching for releasing the membrane structure such that the membrane is vibratable. The substrate etching as illustrated in FIG. 4b may be performed so as to release a first inner region of the main surface 14A of the membrane structure 14 with exception of the edge region 18A and so as to release the second inner region of the main surface 14B of the membrane structure 14 with exception of the edge region 18B. As illustrated in FIG. 2b, within a tolerance range of 10%, the edge regions 18A and 18B may comprise a same extension perpendicular to a surface normal of the main surface 14A.

For example, the gap 22 may be obtained by using a carbon material which is applied during the transducer fabrication onto at least an upper and/or lower main surface region and/or the side regions of the membrane structure. The carbon material may be selectively removed after completion of the transducer elements by obtaining, through a well-controlled, cold, gaseous action process with oxygen (gas phase), the desired or required undercutting of the carbon material. By this, the resulting slit with the thickness based on the thickness of the carbon material may be obtained, wherein some ash material may remain in the gap. During the final etching process, i.e., an incineration process, of the carbon material, e.g., an oxidized layer having the thickness of an atom layer, i.e., a thickness of 1 nm, may result on the membrane surface. However, such a layer does not have an influence to be considered on the resulting electric or acoustic properties of the membrane at a membrane thickness which may be, for example, between 300 and 600 nm, wherein this does not exclude smaller or larger dimensions. One aspect of the embodiments described herein is to obtain a small slit, possibly filled with air, between the membrane and at least one surrounding border material, i.e., the substrate structure in order to obtain a membrane that is released at least in the gap regions. The membrane therefore comprises an increased insensitivity with respect to stress from the outside. Since the carbon material comprises an extremely high etching selectivity to the oxide material (TEOS), polysilicon and nitride, the thinly applied carbon material can be removed from the gap between the border material and the respective surface region of the membrane in an extremely precise manner.

A suitable material as carbon, which can be removed by a cold, gaseous etching process with oxygen (in the gas phase), the oxygen being activated by plasma, the etching being carried out by radicalization of the oxygen obtained by the plasma. The described gap may be used for dual-backplate configurations and for single-backplate configurations. In a single-backplate configuration, the carbon gap may also be used to avoid formation of hotspots. In this configuration, however, it may be noted that very large process variations of +/−20 µm (i.e., 40 µm) may occur with regard to the cavity etching, so that, e.g., an undercut having a width of 50 µm may be implemented to remove the carbon material in order to ensure that the carbon edge is obtained in a projection from above outside of the edge of the lower border material (substrate material) for the lower attachment of the membrane. In contrast, the edge of the upper and the lower border materials may be obtained between the upper surface of the membrane and the upper counterelectrode and the lower border material may be obtained between the lower surface of the membrane and the lower counterelectrode with a significantly higher accuracy, e.g., 7 µm+/−1 µm, so that an undercutting or removal of the carbon material of at least 10 µm may be sufficient in this constellation.

As silicon used for the transducer membrane is very susceptible to tensile stresses due to the low layer thickness of the membrane, whereas compressive stresses are relatively uncritical, measures are taken to increase robustness. Depending on the position of the border region of the material of the border attachment, i.e., the corner regions 32, so-called hotspots for pressure loads occur with the laterally clamped membrane. This is also referred to as Kerf-effect. In a dual-backplate configuration, the perforation openings (etching holes or release holes) in the opposite counterelectrodes are selected to define the edge of the border material and therefore the respective hotspots for the clamped silicon membrane. Depending on the clamping or the clamping edges (clamping lines) of the membrane at the border region, the robustness of the membrane differs with respect to pressures applied from above or from below. Above and below are used herein so as to simplify the understanding of the embodiments. By non-limiting example only, below may refer to a region of the MEMS-transducer adjacent to the cavity of the transducer. In a bottom-port microphone, e.g., the border regions are arranged to be offset such that the lower border region is set back with respect to the upper border region in order to obtain an increased robustness at the upper hotspot for pressure loads from below.

In order to maintain the robustness from above and below at the same level, a slit/gap is created between the upper material of the border region and the upper surface of the membrane in order to eliminate the upper hotspots since a relatively loose support (clamping) between the upper border material and the upper surface region of the membrane occurs at the edge of the upper material of the border region so that the upper hotspot is avoided when a pressure is applied from above, and the membrane may be deflected downwards due to the slit and therefore no hotspot that is critical with respect to large tensile stresses is created between the upper border material and the surface region of the membrane. This makes it possible to obtain virtually identical tensile/compressive ratios for pressure loads of the membrane from above and below.

For such a purpose, the recess, slit or gap between the upper surface region (main surface 14A) and the border material (substrate structure 16) extends in a projection by approximately 2 µm to 5 µm beyond the edge of the lower border material and its connection to the lower surface region of the membrane as described in connection with the overlap extension 23. In principle, the gap between the upper border material and the upper surface region of the membrane structure may be continued up to the border of the membrane; however, the resulting border material may then be configured to be sufficiently stable or the outer membrane end may be offset towards the interior in order to obtain a sufficiently stable border attachment of the membrane structure and/or a sufficiently high robustness of the resulting connection, i.e., of the membrane fixed between the two counterelectrodes.

MEMS-elements have been used for many years and in high numbers. One parameter to be considered is the robustness against high and rapid pressure changes. Embodiments allow for a high robustness of the membrane for pressure and pressure changes from both sides of the membrane. An aspect of the present embodiments is to use a carbon layer. This layer can be etched in a defined manner by use of a plasma process after a release of the active MEMS-layers. By the etching process, there may be obtained a defined lateral undercut or lateral etching allowing to prevent high tensile stresses at the clamping of the membrane structure during pressure loads from a front side of the chip. The high pressure robustness with regard to the back side is maintained at the same time. This idea may be used for dual-backplate MEMS and for single-backplate MEMS. The idea may further be used for obtaining a completely release membrane structure. An increase in the robustness against pressures and pressure changes of the MEMS-chips may allow obtaining a high robustness of MEMS-microphones and/or MEMS-loudspeakers. Embodiments thus allow obtaining a low loss rate of the produced MEMS-transducers.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A MEMS-transducer comprising:
a membrane structure having a first main surface and a second main surface opposing the first main surface;
a substrate structure configured to hold the membrane structure, wherein the substrate structure overlaps with the first main surface of the membrane structure in a first edge region being adjacent to a first inner region of the first main surface;
a gap formed between the membrane structure and the substrate structure in the first edge region and extending from the first inner region into the first edge region; and
a carbon material layer arranged in a layer of the gap and in an outer region of the first main surface, the outer region being adjacent to the gap in a direction towards and extending to an outer edge of the membrane structure,
wherein the substrate structure overlaps with the second main surface of the membrane structure in a second edge region being adjacent to a second inner region of the second main surface, wherein the MEMS-transducer comprises a second gap formed between the membrane structure and the substrate structure in the second edge region and extending from the second inner region into the second edge region,
wherein the membrane structure comprises a vibratable membrane structure and the MEMS-transducer comprises a passivated MEMS-transducer, and
wherein within a tolerance range of 10%, the first and second edge region comprise a same extension perpendicular to a surface normal of the first main surface,
wherein the carbon material layer is in direct physical contact with the entirety of the first main surface of the membrane structure in the outer region and/or is in direct physical contact with the entirety of the second main surface of the membrane structure in the outer region, and the carbon material layer provides for a clamping of the membrane structure.

2. The MEMS-transducer of claim 1, wherein the first edge region overlaps with a larger portion of the first main surface when compared to a portion of the second main surface being overlapped by the substrate structure in a second edge region of the second main surface.

3. The MEMS-transducer of claim 1, wherein a surface normal of the first main surface directs along a thickness direction of the membrane structure, wherein the gap comprises a first extension along the thickness direction, the first extension being at least 1 nm and at most 40 nm.

4. The MEMS-transducer of claim 1, wherein a surface normal of the first main surface directs along a thickness direction of the membrane structure, wherein the gap comprises a second extension perpendicular to the thickness direction and towards an outer edge of the membrane structure starting from the first inner region, the second extension being at least 1 µm and at most 200 µM.

5. The MEMS-transducer of claim 1, wherein an ash material is arranged in the gap between the substrate structure and the membrane structure.

6. The MEMS-transducer of claim 1, wherein, in a projection into the first main surface, the gap overlaps with a region of the substrate structure to which the second main surface is mechanically fixed, by at least 1 µm.

7. A method for producing a MEMS-transducer, the method comprising:
arranging a layer stack comprising a membrane structure, a substrate structure holding the membrane structure and a carbon layer arranged between the membrane structure and the substrate structure;

removing the carbon layer at least partially so as to generate a gap between the membrane structure and the substrate structure in a first edge region, such that the gap extends from a first inner region of a first main surface of the membrane structure into a first edge region in which the substrate structure overlaps with the first main surface of the membrane structure, the first edge region being adjacent to the first inner region of the first main surface, wherein removing of the carbon layer is performed after a substrate etching, for releasing the membrane structure such that the membrane is vibratable and/or performed after passivating the MEMS-transducer, wherein the substrate etching is performed so as to release a first inner region of a first main surface of the membrane structure with exception of a first edge region and so as to release a second inner region of a second main surface of the membrane structure with exception of a second edge region, and wherein within a tolerance range of 10%, the first and second edge region comprise a same extension perpendicular to a surface normal of the first main surface.

8. The method of claim 7, wherein removing of the carbon layer comprises execution of an etching process using oxidation such that an ash material is obtained as a remains on the membrane structure.

9. A MEMS-transducer comprising:
- a membrane structure having a first main surface and a second main surface opposing the first main surface;
- a substrate structure configured to hold the membrane structure, wherein the substrate structure overlaps with the first main surface of the membrane structure in a first edge region being adjacent to a first inner region of the first main surface; and
- a gap formed between the membrane structure and the substrate structure in the first edge region and extending from the first inner region into the first edge region, wherein the gap is a first gap, wherein the substrate structure overlaps with the second main surface of the membrane structure in a second edge region being adjacent to a second inner region of the second main surface, wherein the MEMS-transducer comprises a second gap formed between the membrane structure and the substrate structure in the second edge region and extending from the second inner region into the second edge region; and a third gap arranged at a side surface of the membrane structure, connecting the first main surface and the second main surface, wherein the first, second and third gap provide for a slack holding of the membrane structure by the substrate structure such that the membrane structure is not physically coupled to the substrate structure, and wherein the first main surface of the membrane structure is completely planar in the first edge region and the second main surface of the membrane structure is completely planar in the second edge region, and wherein the third gap is defined by a vertical sidewall of the substrate structure and a vertical sidewall of the membrane structure.

10. The MEMS-transducer of claim 9, wherein the gap completely uncovers the first main surface from the substrate structure.

* * * * *